United States Patent [19]
Rollins et al.

[11] Patent Number: 5,394,476
[45] Date of Patent: Feb. 28, 1995

[54] VOLUME CONTROL DEVICE

[75] Inventors: Norman T. Rollins, Sunrise; King F. Lee, Ft. Lauderdale, both of Fla.

[73] Assignee: Motorola, Inc., Schaumburg, Ill.

[21] Appl. No.: 992,356

[22] Filed: Dec. 17, 1992

[51] Int. Cl.⁶ .......................... H03G 3/00; H04B 1/10
[52] U.S. Cl. .................................. 381/104; 381/109; 455/219
[58] Field of Search ................. 381/109, 104, 107; 455/212, 218, 219; 375/104

[56] References Cited

U.S. PATENT DOCUMENTS

| | | |
|---|---|---|
| 4,237,448 | 12/1980 | Weinberg . |
| 4,387,469 | 6/1983 | Miyazaki et al. ............... 455/161.3 |
| 4,390,834 | 6/1983 | Ohshita . |
| 4,550,400 | 10/1985 | Henderson, Jr. et al. .......... 381/107 |
| 4,715,063 | 12/1987 | Haddad et al. . |
| 4,721,923 | 1/1988 | Bares et al. . |
| 4,741,018 | 4/1988 | Potratz et al. . |
| 4,829,563 | 5/1989 | Goldberg ........................ 381/107 |
| 4,962,545 | 10/1990 | Klaczak et al. . |
| 5,010,577 | 4/1991 | Sakanishi et al. .................. 381/104 |
| 5,146,479 | 9/1992 | Okada et al. . |
| 5,189,705 | 2/1993 | Lavaud .......................... 381/109 |
| 5,201,009 | 4/1993 | Yamada et al. ..................... 381/98 |

OTHER PUBLICATIONS

Motorola product literature entitled "Saber TM I, II and III Conventional Portable Radios" R3-4-151A.

*Primary Examiner*—Curtis Kuntz
*Assistant Examiner*—Ping W. Lee
*Attorney, Agent, or Firm*—Juliana Agon; M. Mansour Ghomeshi

[57] ABSTRACT

A volume control circuit comprises a variable gain stage (306), having a variable gain, and an up/down counter (324) for counting. The counter (324) has a counter input (321) and a counter output (333) for providing a first word (333) for controlling the gain of the gain stage. A microprocessor interface (326) includes an interface output (323) for providing a second word. A digital magnitude comparator (333) compares the first (323) and second (333) words. The comparator having a first input (333) connected to the counter output, a second input connected to the interface output (323), and a comparator output connected to the counter input (321), provides a count signal (329) if the words do not match and for providing a non-count signal (329) if the words match. Thus, responsive to the count signal (329), the up/down counter (324), counts from the first word, in a direction approaching the second word by a least significant bit to form a new first word, for controlling the gain of the gain stage.

2 Claims, 4 Drawing Sheets

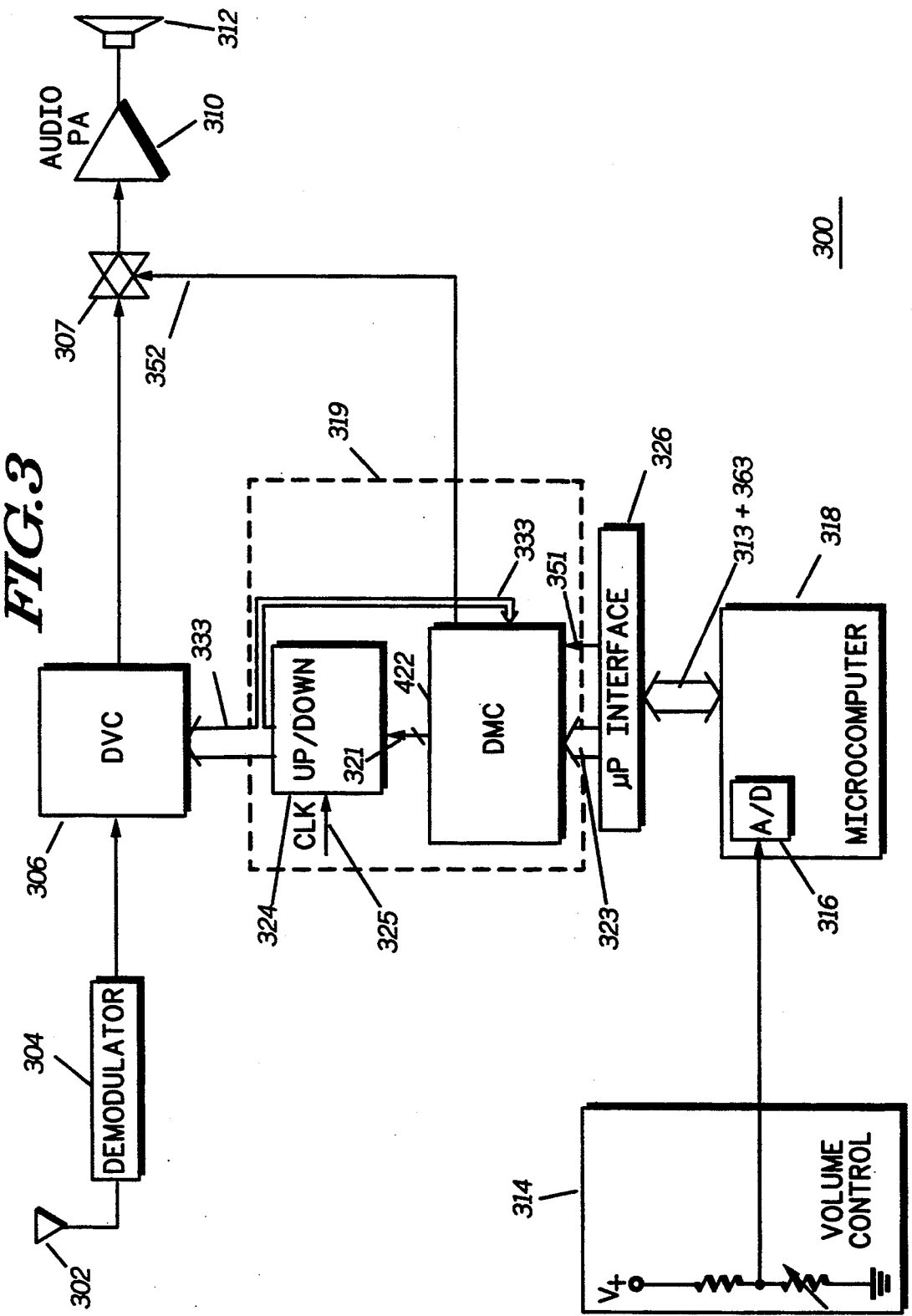

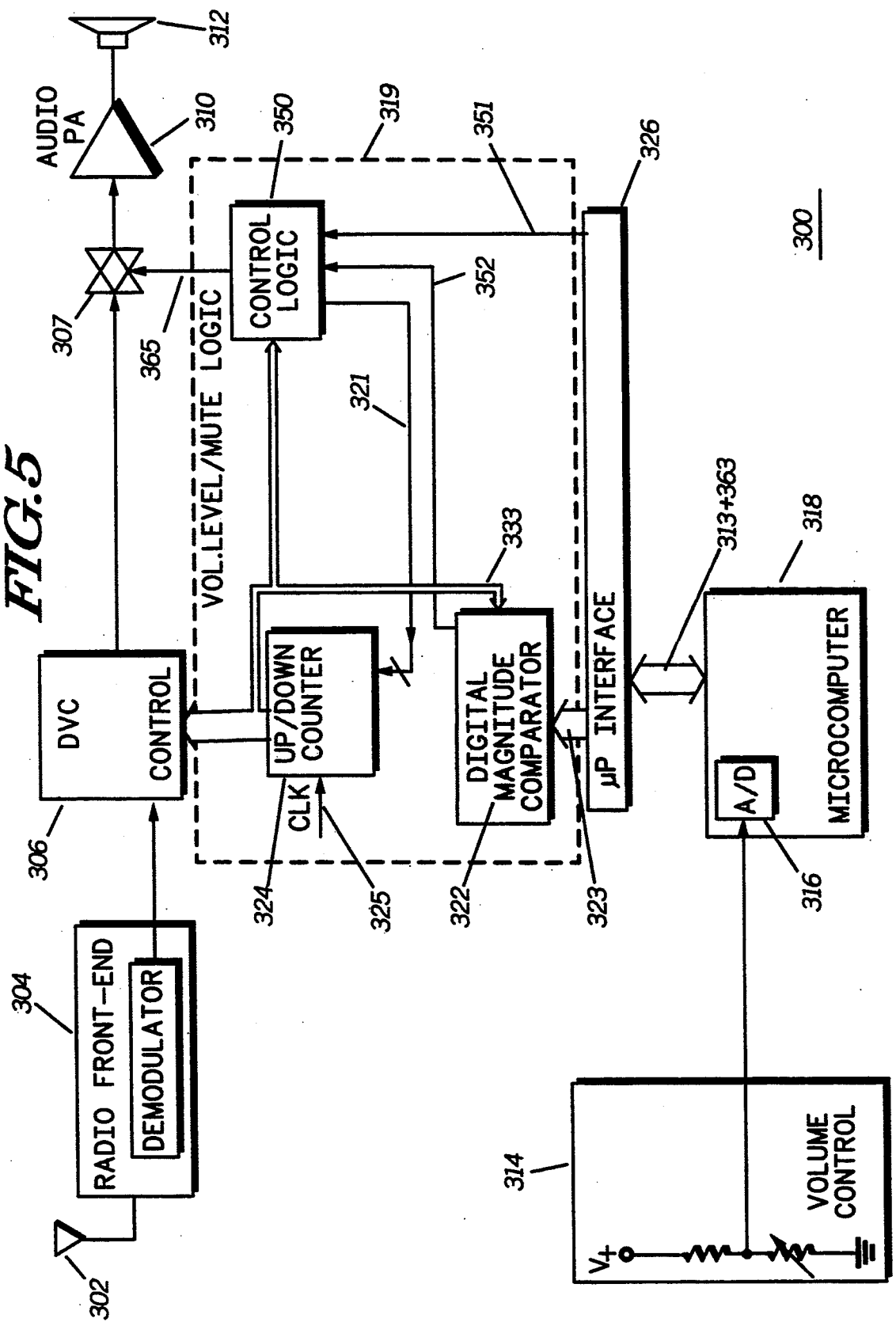

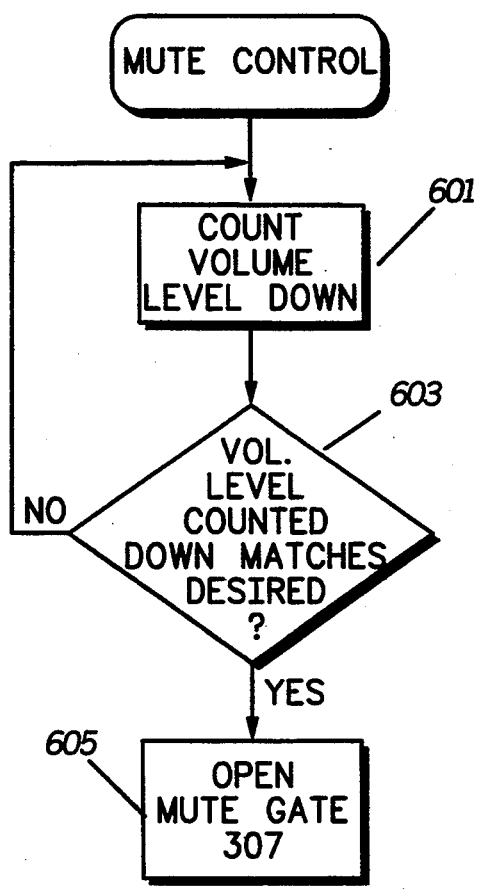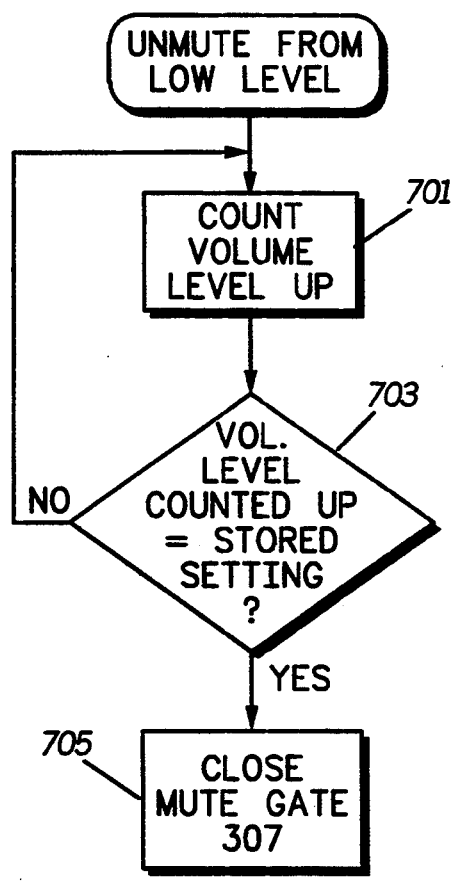

VOLUME CONTROL DEVICE

TECHNICAL FIELD

This invention relates generally to volume controls and more particularly to a digital type of volume control circuit, implementable on an integrated circuit, which regulates the intensity of an audio signal by virtue of electronics.

BACKGROUND

In general, a volume control is a potentiometer (variable resistor) for adjusting the loudness of an audio signal of a radio receiver or amplifying device. It is well known that a potentiometer ("pot") can be an electromechanical device which varies the loudness of a reproduced sound by varying the voltage amplitude of the electrically represented audio signal, by mechanically varying the resistance.

As a substitute for the mechanical potentiometer, electronic volume controls have been developed in the prior art. One electronic volume control uses an analog attenuator to attenuate the magnitude, or level, of sound in a continuous fashion, by varying the collector currents of transistors therein to change the internal resistances of the attenuator. In this analog arrangement, the controlling factor is an analog DC voltage amplitude.

In recent years, a digital volume control (DVC), or a "soft-pot" has been developed to vary the resistance digitally. In the DVC, the controlling factor is a digital word, having discrete values, which is software programmable to change the resistance. In communication devices, such as portable radios, including receivers, a DVC is often used in the audio path to provide programmable volume control of the audio amplifier. The audio path includes the DVC, along with a microprocessor, an analog to digital (A/D) converter circuit, the mechanical potentiometer (or volume control knob), and an audio amplifier. The A/D is included in the path to transform the mechanical volume setting to a digital setting for controlling the signal reaching the audio amplifier. This more complex volume control scheme serves to reduce the noise level in the demodulated audio picked-up when the audio path is routed to the mechanical pot.

However, in this audio path, a sudden sharp rise 12 or fall 14, set by the DVC, occurs, whenever a new digital word is programmed into the DVC, as seen in FIG. 1. The magnitude of the audio step depends on the difference between the old and new words, that is, the larger the difference, the larger the step. This quantization transient may also be amplified substantially by succeeding stages. For example, transients from changing the digital volume control (DVC) control word, are amplified by the audio power amplifier (PA). This commonly results in mechanical-like clicking sounds heard at the speaker which can be very irritating to the user. The magnitude of this problem is directly proportional to the magnitude of the change in the programmed DVC settings.

Even larger transients occur when the audio path is muted or unmuted as seen in FIG. 2. During priority scanning for the priority channel, for instance, the demodulated audio filtering path is rapidly muted and unmuted, resulting in "popping" noises at the speaker. Accordingly, there exists a need to reduce gain change and/or muting/unmuting signal transients.

SUMMARY OF THE INVENTION

Briefly, according to the invention, a volume control circuit comprises a variable gain stage, having a variable gain, an up/down counter for counting, and a digital magnitude comparator. The counter has a counter input and a counter output for providing a first word for controlling the gain of the gain stage. A microprocessor interface includes an interface output for providing a second word, in response to a mechanical potentiometer setting. The digital magnitude comparator compares the first and second words. The comparator having a first input connected to the counter output, a second input connected to the interface output, and a comparator output connected to the counter input, provides a count signal if the words do not match and provides a non-count signal if the words match. Thus, responsive to the count signal, the up/down counter, counts from the first word, in a direction approaching the second word by a least significant bit to form a new first word, for controlling the gain of the gain stage.

BRIEF DESCRIPTION OF THE DRAWINGS

FIG. 3 is a simplified block diagram of a receiver in accordance with the present invention.

FIG. 5 is a block diagram of a receiver in accordance with an alternate embodiment of the present invention.

FIG. 6 is a flowchart of the mute logic for the logic block 319 of FIGS. 3 and 5.

FIG. 7 is a flowchart of the unmute logic for the logic block 319 of FIGS. 3 and 5.

DETAILED DESCRIPTION OF THE PREFERRED EMBODIMENT

Figure 1:
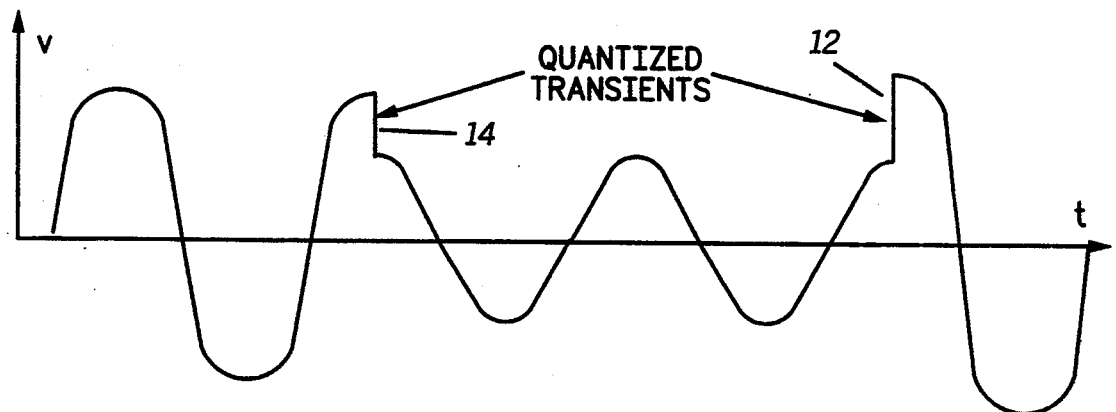
FIG. 1 is a graph of DVC output amplitude versus time, for illustrating non-minimal word changes.
Figure 2:
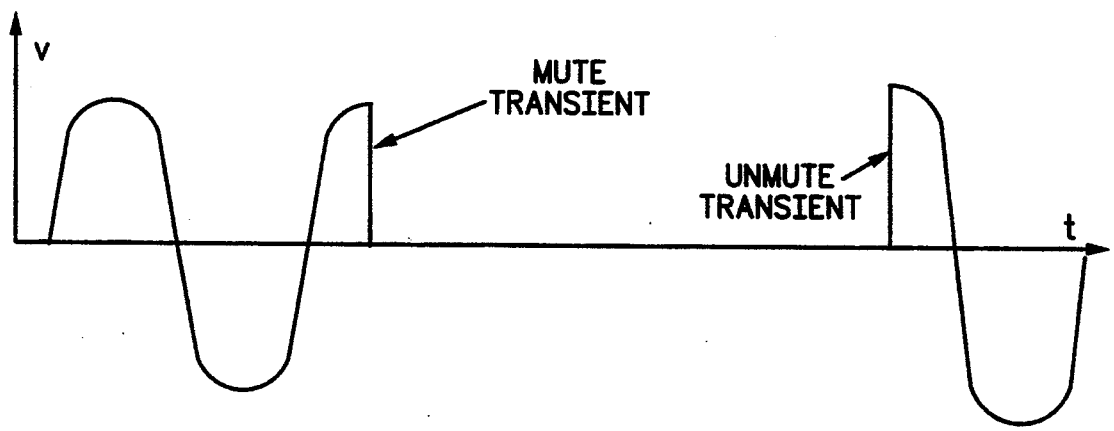
FIG. 2 is a graph of DVC output amplitude versus time showing muting and unmuting, for illustrating large magnitude changes in audio level due to muting.

Referring to FIG. 3, a communication device such as a radio or a receiver 300, is controlled by a microcomputer 318. An antenna 302 is connected to the "front-end" 304 of a radio or a radio frequency receiver 300. The radio front end 304 includes a demodulator whose output is connected to the input of a gain or attenuation stage such as a digital volume control (DVC) or step attenuator 306. The DVC 306 preferably has a plurality of steps wherein the minimum step size is determined by the least significant bit (LSB). The DVC 306 has a control input for selecting one of the plurality of programmable attenuation steps. The output of the DVC is connected to none, one or more audio circuitry stages, such as amplification, prior to a mute control gate 307, before connecting to a speech amplifier such as an audio power amplifier 310. Alternatively, the mute control gate could be placed before the DVC 306. A speaker 312 is connected to the output of the audio power amplifier 310.

Conventionally, the mute gate 307 responds to a muting signal 351, controlled by the microcomputer 318. In the presence of a mute command 363, the mute control gate 307 will open-circuit to prevent the output of the DVC 306 from reaching the audio power amplifier 310.

In the absence of a mute signal, however, the line 363 will allow the mute gate 307 to pass the audio signal to the audio PA 310.

A mechanical rotary potentiometer 314 has its ends connected between a DC voltage. The wiper-terminal of the potentiometer 314 is connected to the input of an analog-to-digital (A/D) converter 316, which may be an A/D port of a microprocessing means, such as the microcomputer 318, having a microprocessor (uP) and memory. The A/D converter 316, preferably is included in the microcomputer 318, but could be externally connected to a digital input port of the microcomputer 318.

When a low volume is selected by appropriate rotation of the volume control 314, the analog DC voltage that appears on the wiper of the potentiometer 314 is converted to a digital signal by the A/D converter 316. The microcomputer 318 sends an appropriate control signal to the DVC 306 wherein the gain will be set at a predetermined level.

In the preferred embodiment, a Motorola MC1468HC11 microcomputer is used. One output port of the microcomputer 318 is connected to the control input of the DVC 306. The microcomputer 318 may contain well known "look-up" table software, in its memory, that selects, based on the rotation angle of the volume control 314, a particular attenuation for the DVC 306. Alternatively, the microcomputer 318 may simply feed the exact A/D output to the DVC 306. More particularly, the microcomputer 318 reads the binary output of the A/D converter 316 which corresponds directly to the rotation angle of the volume control 314, looks up the corresponding pre-determined step attenuator setting in the table, and then sets the DVC 306 accordingly. Mathematically, the look-up table discretely emulates the continuous rotation angle of the volume control 314. To simplify communication between the microcomputer 318 and the DVC 306 or the mute gate 307, a microprocessor (uP) interface 326 may be included.

Thus, the DVC 306 provides a variable gain means for varying the amplitude of the audio signal that appears at the demodulator output of the radio front end 304. The microcomputer 318 provides a controlling means for controlling the gain of the DVC 306. The potentiometer 314 provides a volume selecting means for selecting the volume of speech emitted from the speaker 312, as a function of the rotation of the potentiometer 314. However, when the DVC control word is changed, the resultant sudden loudness or quietness may be objectionable to the listener.

Figure 4:
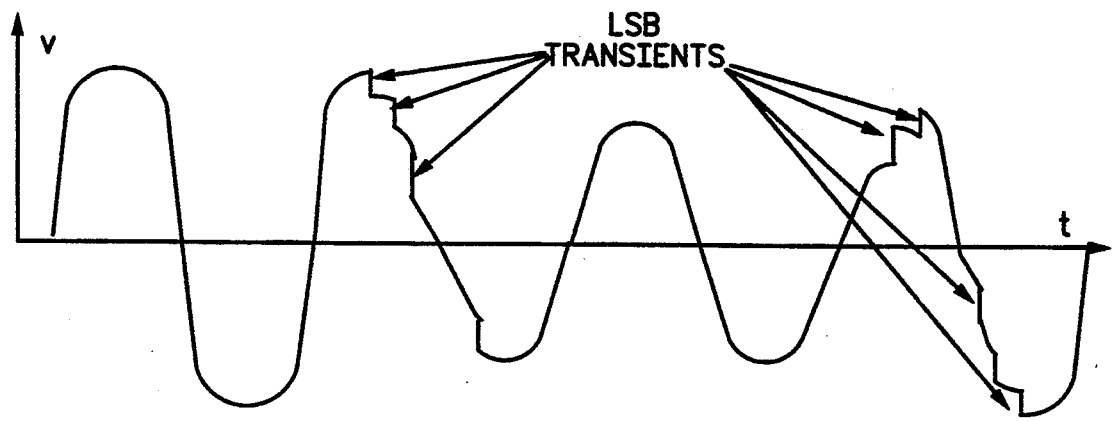
FIG. 4 is a graph of DVC output amplitude versus time showing minimal LSB word changes, for illustrating small stepwise discrete steps, substituted for the large magnitude audio level changes of FIG. 1, in accordance with the present invention.

A solution which minimizes these transients is to always up or down-count a gain setting by only one LSB, or another step size, at a time, until the desired gain setting is reached, as seen in the "staircase" audio signal waveform of FIG. 4. Accordingly, a volume level and mute logic block 319, including a digitude magnitude comparator 422 (or 322 in FIG. 5), an up/-down digital counter 324, and a control logic 350 of FIG. 5, is added in between the uP interface 326 and the DVC 306 to intercept, modify, or control the volume level setting and/or the muting, in a manner that eliminates most objectionable noises. Alternatively, the control logic 350 of FIG. 5 can be implemented within the combinational logic of the digital magnitude comparator 422 of FIG. 3. Preferably, each of the digital magnitude comparators (DMC) 322 and 422 compares the binary numbers presented on two inputs (323 and 333) for equality and has three possible output states on the result path 321: less than, equal to, or greater than. Thus, a control signal having one or more lines 321, representing a greater, less than, or equal condition, may be generated by the comparator 422 or 322 to control the direction and count of the counter 324. Accordingly, a greater than condition would cause the counter 324 to count up, a less than condition would cause the counter 324 to count down, and an equal condition would stop the count and leave the last counted word, at status quo.

Referring to FIGS. 3 and 5, the DVC 306 is controlled by the volume level and mute logic 319. Since the finest audio amplifier gain resolution produces the smallest possible quantization transient, the resistance of the DVC is controlled to be always increased or decreased, by the smallest step or incremental size. This attenuation control is produced by the level control logic provided by the digitude magnitude comparator 422 or 322 and the up/down digital counter 324, preferably implemented using dedicated hardware.

The microcomputer 318 alone, or together with the uP interface 326, form a volume control generator. More specifically, the volume control generator comprises the volume control 314, the microcomputer 318 having the A/D port, and the uP interface 326. In any case, the volume control generator outputs a signal on a plurality of lines 323, indicative of the volume control data present on a bus 313, to form a first or reference word having gain control bits, for providing volume control data corresponding to a desired quantity of programmable attenuation. Instead of directly using the information of the signal 323 as the first word, that information can be first stored in a memory within the uP interface 326, for use as a first word reference for later comparisons.

The counter 324 counts clock signals having a predetermined period generated by a clock source 325 and provides an output signal that is indicative of numerical data, in the form of a second, incremental or step-changed word, having up/down-counter output control bits, corresponding to the counts and which changes periodically. The second word is formed by modifying, such as counting up or down, from the first word, by the least significant bit, or another stepsize change, for controlling the gain of the DVC 306. The up/down counter 324 includes a direction input 321 for receiving a direction bit for controlling the direction of the count (up or down). The up/down counter 324, responsive to a count signal 329 and a direction signal 352 from the comparator 322, counts from the second word, in a direction approaching the first word by the least significant bit to form a new second word, for controlling the gain or step attenuation of the DVC 306.

The frequency of the clock 325 is controlled such that the time between the least significant bit (LSB) steps is short enough to reach the desired gain setting, within the required path attack time. However, the time is also delayed long enough to minimize the overall transient in the resulting "staircase" waveform of FIG. 4.

Assuming first that there is no mute command for the control logic 350 to further modify the input of the counter 324, outputs 352 and 321 of FIG. 5 would have the same information. The comparator 322 compares the signal, indicative of the first word, with a signal on a plurality of lines 333, indicative of the second word. Specifically, the gain control bits outputted by the microprocessor uP interface is compared with the up/- down-counter output gain control bits. If the two words do not match, the up/down-counter would be up- or down-counted, by an internal clock, until the output setting matches the new uP interface setting. Accordingly, when the first word is greater than the second word, the comparator 322 outputs a count up indication on the signal 321. Correspondingly, when the first word is less than the second word, the comparator 322 outputs a count down indication on the same signal 321. When the two words match, a stop-counting indication on the signal 321, causes the counter 324 to provide the first word, which is now equal to the second word, for controlling the gain, or step attenuation, of the DVC 306.

Thus, when the volume control 314 is changed by a setting, that is greater than a least significant bit, the change is implemented by the DVC 306, as controlled by the volume level logic 319, in least significant bit steps. Accordingly, even when the volume control 314 is quickly changed, the actual gain increases/decreases are in small discrete steps of a staircase function, as seen in FIG. 4, and the perceived loudness at the speaker 312 appears to be smoothly and continuously increased/decreased.

Similarly, muting transients can be minimized by down-counting the receive audio path gain to a minimum, before the path is muted by the mute gate 307, as controlled by the control logic block 350, external of the DMC 322 of FIG. 5, or interally within the DMC 422 of FIG. 3. Likewise, unmuting transients can be minimized by unmuting the path, while at a minimum gain, and then up-counting the gain to the previously stored programmed setting.

Additional logic, in the control logic 350, is added so that a mute bit (363) could be applied and the gain bits (333) would automatically be down-counted to a minimum gain before the mute bit output (365 of FIG. 5 and 352 of FIG. 3) is changed. The control logic 350 intercepts the control signal of the mute line 363, 351 and the output line 352 in FIG. 5 of the comparison to provide further controls and conditions, before operating the mute gate 307 via the mute control output line 365.

The microprocessor interface 326 includes a second interface output 351 for providing either a mute or an unmute indication. The control logic 350 includes a mute control input for receiving the mute or unmute signal 351, a mute control comparator input 352, and a mute output 365 for controlling the mute control gate 307. A counter input for receiving the signal 333 is used for comparing it with a second word override reference, in a comparison operation within the control logic 350. An override output 321 provides the count instruction to the direction/count input of the counter, based on the comparison result within the control logic 350 (to count or not count), instead of within the DMC 322 (ignoring the 352 input) and is further responsive to the mute signal 351 (for direction). The up/down counter 324, responsive to the count/direction instruction 321, counts from the second word, in the direction specified, approaching the override word, controlled by the control logic 350, as a new first word, until the new second word matches the new first word. The new first word is predeterminately set by the control logic 350, depending upon whether muting or unmuting is desired. For example, the override word is set to be a minimal low value for muting, or the override word, for unmuting from a muted state (at minimal low level), is the same first word previously set (or stored), as the DVC setting.

For the muting case, the control logic 350 provides a count down indication on the signal 321, if the words of the override reference and the signal 333 do not match, and for providing a mute or open switch indication, on the output 365, if the words match, to disconnect the gate 307.

For the muting case from an unmuted low level state, the control logic 350 provides a count up indication on the signal 321, if the words of the override reference and the signal 333 do not match, and for providing an unmute or close switch indication on the signal 365, if the words match, to provide a close signal at the mute output 365 for connecting the gate 307.

Hence, for muting, the direction/count output 321 provides a down signal. This down signal is in response to the mute indication or state of the mute line 351, as provided by the uP interface 326, in the case of a presence of the mute command, as determined on the mute line 363. As previously described, the up/down counter 324, responsive to the direction/count signal 321, down-counts from the second word of the counter output 333, which is the current volume level of the DVC 306, until the new second word matches the new first or override word. However, in this case, the new first word is controlled, or overridden by the control logic 350, to represent a predetermined minimum gain setting.

Referring to FIG. 6, the volume level is down-counted (601) first and then muting occurs (605). The mute gate 307 will only be unmuted if, and only if (603), the counter 324 reaches the predetermined low volume setting.

Referring to FIG. 7, the logic for unmuting from a muted state works similarly. The volume level is counted up (701) to the previously programmed final setting (703), from an initial unmute low level state, after closing (705) the mute gate 307.

Specifically, the direction/count output 321 provides an up signal, in response to the unmute indication on line 351. As previously described, the up/down counter 324, responsive to the direction/count signal 321, up-counts from the second word (333) of the counter output 324 (which is, now, at the current minimum volume level of the DVC 306) until the new second word matches the new first or override word. However, in this case, the new first word is controlled by the logic within the control logic 350 to represent the audible gain setting of the previously stored first word. Alternatively, the override word need not be previously stored because the first word is still available, or unchanged, at the volume control uP interface output 323. In other words, the first word need not be replaced at all and can be used as is. Thus, the results of the comparison at the comparator 322 need not be overriden by the comparison in the control logic 350, to again provide the same results on lines 321 and 352.

Accordingly, the advantages, provided by the volume control and mute control dedicated hardware, are that quantized and mute/unmute transients are minimized, with no additional microprocessor software overhead, in terms of uP processing current drains. Thus, the volume level and mute control block produces the smallest possible transients using existing path gain adjustments.

What is claimed is:

1. A receiver comprising:

an audio stage;

a digital volume control having a variable attenuation;

a mute control gate connectable between the audio stage and the digital volume control, the gate having a gate control input, a mute disconnected state, and an unmute connected state;

an up/down counter for counting, the counter having a counter input and a counter output, the counter output providing an incrementing word for controlling the variable attenuation of the digital volume control;

microprocessing means for controlling the receiver, the microprocessing means having a microprocessor volume level output for providing a reference word and a mute output for switching the state of the mute control gate; and a digital magnitude comparator having logic means for controlling volume level and muting, a reference input for receiving the reference word, the comparator having a comparison input connected to the counter output for comparing the incremental word against the reference word, and a comparator output connected to the counter input for providing a count signal if the words do not match and for providing a non-count signal if the words match;

the logic means intercepting the mute output for disabling switching of the mute control gate until the words match; and the up/down counter, responsive to the count signal, counts from the incremental word, in a direction approaching the second word by an incremental change to form a new incremental word, for controlling the incremental attenuation of the digital volume control.

2. The receiver of claim 1, wherein the logic means sets a predetermined minimum gain setting and substitutes it as the reference word, in response to the mute output for switching the state of the mute control gate from the unmute connected state to the mute disconnected state.

* * * * *